United States Patent
Simin et al.

(10) Patent No.: US 7,674,666 B2
(45) Date of Patent: Mar. 9, 2010

(54) FABRICATION OF SEMICONDUCTOR DEVICE HAVING COMPOSITE CONTACT

(75) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 171 days.

(21) Appl. No.: 11/781,308

(22) Filed: Jul. 23, 2007

(65) Prior Publication Data

US 2008/0206974 A1  Aug. 28, 2008

Related U.S. Application Data

(60) Provisional application No. 60/903,109, filed on Feb. 23, 2007, provisional application No. 60/905,725, filed on Mar. 8, 2007, provisional application No. 60/903,104, filed on Feb. 23, 2007, provisional application No. 60/905,634, filed on Mar. 8, 2007.

(51) Int. Cl.
*H01L 21/338* (2006.01)
(52) U.S. Cl. ............................. 438/172; 257/E21.181
(58) Field of Classification Search ................ 438/167, 438/172; 257/E21.181
See application file for complete search history.

(56) References Cited

U.S. PATENT DOCUMENTS

| | | | |
|---|---|---|---|
| 5,126,284 A | 6/1992 | Curran | |
| 5,196,907 A | 3/1993 | Birkle et al. | |
| 5,241,193 A | 8/1993 | Pfiester et al. | |
| 6,207,584 B1 | 3/2001 | Shen et al. | |
| 6,285,042 B1 | 9/2001 | Ohtani et al. | |
| 6,589,822 B1 | 7/2003 | Yamazaki et al. | |
| 6,690,042 B2 | 2/2004 | Khan et al. | |
| 6,878,593 B2 | 4/2005 | Khan et al. | |
| 6,903,385 B2 | 6/2005 | Gaska et al. | |
| 2001/0009785 A1 | 7/2001 | Arafa et al. | |
| 2004/0036086 A1 | 2/2004 | Khan et al. | |
| 2004/0061129 A1 | 4/2004 | Saxler et al. | |
| 2005/0173728 A1 | 8/2005 | Saxler | |
| 2005/0274977 A1* | 12/2005 | Saito et al. | 257/192 |
| 2007/0295993 A1* | 12/2007 | Chen et al. | 257/194 |
| 2009/0008804 A1* | 1/2009 | Standing et al. | 257/787 |

OTHER PUBLICATIONS

PCT International Search Report and Written Opinion; Jul. 30, 2008; 10 pages.
U.S. Appl. No. 11/781,302; "Office Action", May 1, 2009, 12 pages.

(Continued)

*Primary Examiner*—Bradley K Smith
(74) *Attorney, Agent, or Firm*—John W. LaBatt; Hoffman Warnick LLC

(57) ABSTRACT

A method of fabricating a semiconductor device with a composite contact is provided. The fabrication includes forming the composite contact to a semiconductor layer in a semiconductor structure. The composite contact is formed by forming a DC conducting electrode attached to a semiconductor layer in a semiconductor structure and forming a capacitive electrode that is partially over the DC conducting electrode and extends beyond the DC conducting electrode. The composite contact provides a combined resistive-capacitive coupling to the semiconductor layer. As a result, a contact impedance is reduced when the corresponding semiconductor device is operated at high frequencies.

20 Claims, 6 Drawing Sheets

OTHER PUBLICATIONS

U.S. Appl. No. 11/781,302; "Amendment to Office Action", Jul. 30, 2009, 13 pages.
U.S. Appl. No. 11/781,338, "Office Action", Mar. 6, 2009, 18 pages.
U.S. Appl. No. 11/781,338, "Amendment To Office Action", May 19, 2009, 12 pages.
U.S. Appl. No. 11/781,338, "Final Office Action", Jul. 10, 2009, 15 pages.
U.S. Appl. No. 11/781,338, "Amendment To Final Office Action", Sep. 1, 2009, 17 pages.

* cited by examiner

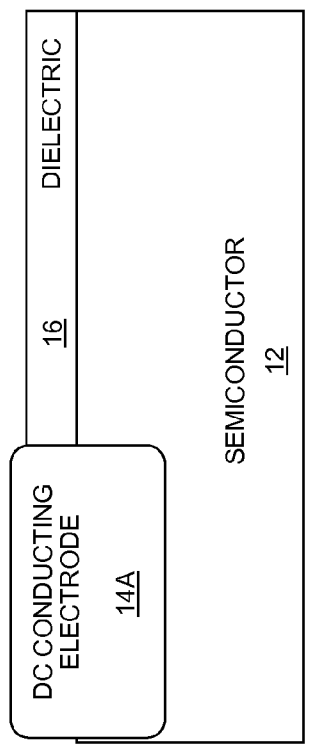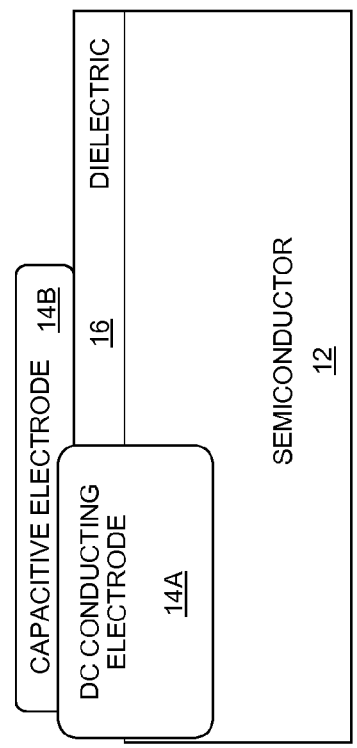

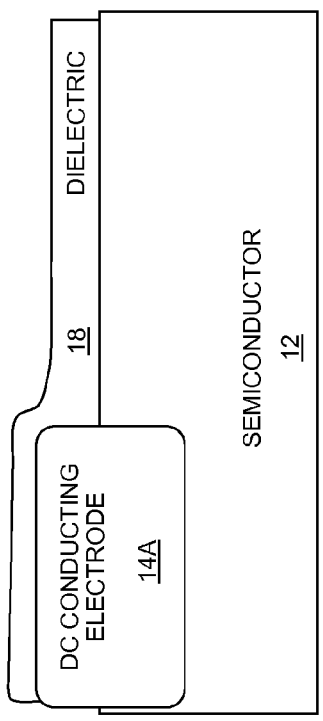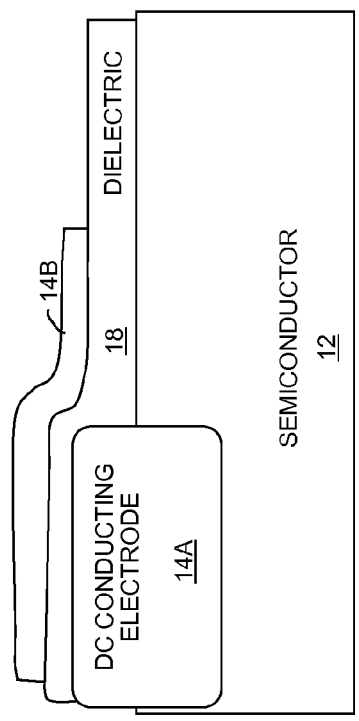

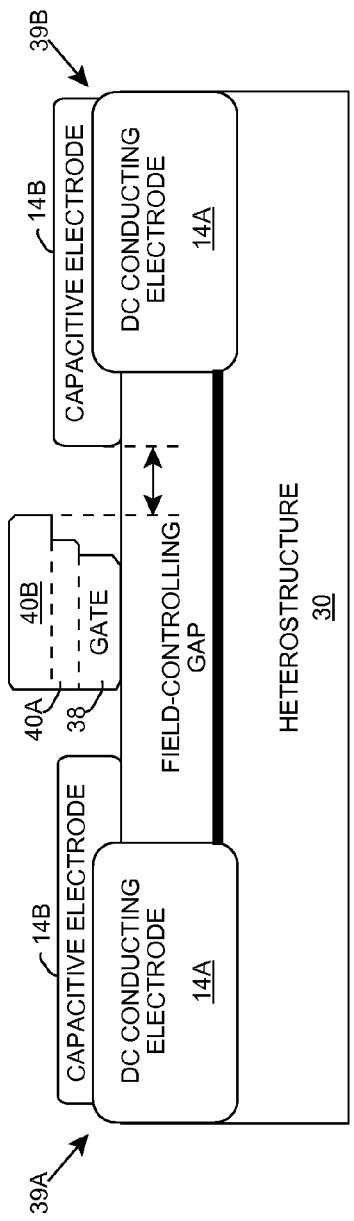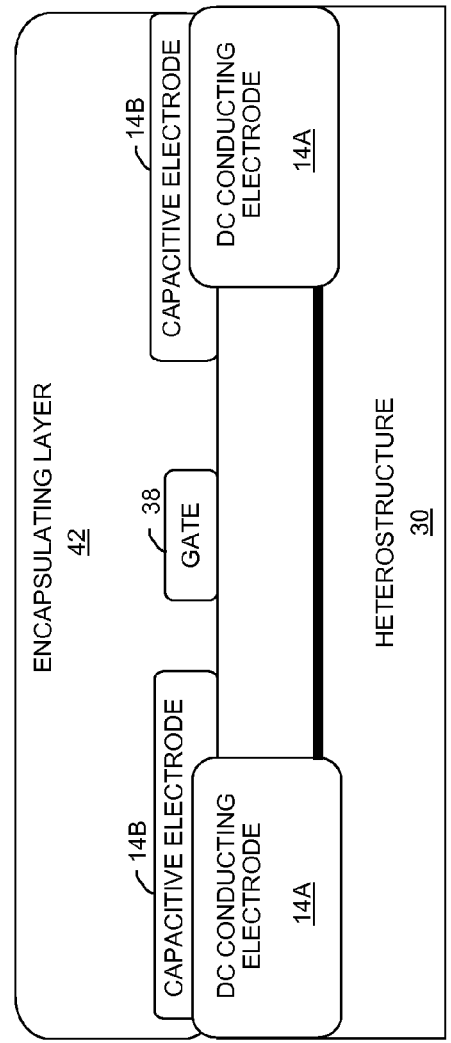

US 7,674,666 B2

FABRICATION OF SEMICONDUCTOR DEVICE HAVING COMPOSITE CONTACT

REFERENCE TO RELATED APPLICATIONS

The current application claims the benefit of co-pending U.S. Provisional Application No. 60/903,109, titled "Method of fabrication of radio-frequency enhanced contacts", which was filed on 23 Feb. 2007 and U.S. Provisional Application No. 60/905,725, titled "Method of fabrication of semiconductor devices with radio-frequency enhanced contacts", which was filed on 8 Mar. 2007, both of which are hereby incorporated by reference. Aspects of the application are also related to U.S. Provisional Application No. 60/903,104, titled "Radio-frequency enhanced contacts to semiconductor devices", which was filed on 23 Feb. 2007, U.S. Provisional Application No. 60/905,634, titled "Radio-frequency enhanced contacts to semiconductor devices", which was filed on 8 Mar. 2007, and co-pending U.S. Utility application Ser. No. 11/781,302, titled "Composite contact for semiconductor device", which was filed on 23 Jul. 2007, all of which are hereby incorporated by reference.

FIELD OF THE DISCLOSURE

Aspects of the disclosure relate generally to contacts for semiconductor devices, and more particularly, to methods of fabricating semiconductor devices/structures that include a composite contact.

BACKGROUND OF THE DISCLOSURE

The formation of a contact for a semiconductor device is an important process in fabricating the semiconductor device. For example, contact resistance significantly affects the performance characteristics of the semiconductor device. As a result, achieving a low contact resistance is typically desired.

However, in many high-frequency semiconductor devices, the resistance of the contact is a dominant factor in limiting the performance of the device. To date, a low contact resistance can be obtained by using high-temperature annealing in the contact formation. Such annealing remains a challenging technology, especially for wide bandgap semiconductor materials. In particular, as the material bandgap increases, the required contact annealing temperature increases, yet the contact resistance also increases. Additionally, contact formation becomes even more challenging with novel emerging wide bandgap material systems and devices, such as material systems/devices based on aluminum nitride (AlN), diamond, and others.

For example, Au/Ge/Ni/Au contacts to gallium arsenide (GaAs) or indium GaAs (InGaAs) require an annealing temperature in the range of 350-425 degrees Celsius and produce unit-width contact resistances as low as 0.1 $\Omega$-mm or even lower. For gallium nitride (GaN), contact formation using Ti/Al contacts requires an annealing temperature in the range of 800-850 degrees Celsius with typical unit-width contact resistances in the range of 0.5-1.0 $\Omega$-mm. While advanced annealing techniques have been shown to yield lower unit-width contact resistances, the general trend in which high annealing temperatures lead to significant morphology degradation, defect generation, and contact edge roughness remains.

It has been demonstrated that capacitance between the metal contact and semiconductor may become important at radio frequencies for a non-ideal annealed contact. To this extent, a conventional, under annealed contact has been proposed, in which there is a capacitive coupling between the metal and the underlying two-dimensional electron gas. In this case, the capacitive coupling has been shown to reduce the access resistance to the two-dimensional electron gas at high frequencies (e.g., radio frequencies). However, access resistance between a device channel and a contact region, where electrons enter into a narrow channel from a thick contact region, remains a large contributor to the overall contact resistance. While the under annealed contact has a smaller impedance at higher frequencies, it does not reduce the access resistance between the device channel and contact region. Further, the under annealed contact does not provide any ability to achieve self-aligned or alignment-free fabrication.

SUMMARY OF THE INVENTION

Aspects of the invention provide a method of fabricating a semiconductor device with a composite contact. The fabrication includes forming the composite contact to a semiconductor layer in a semiconductor structure. The composite contact is formed by forming a direct current (DC) conducting electrode attached to a semiconductor layer in a semiconductor structure and forming a capacitive electrode that is partially over the DC conducting electrode and extends beyond the DC conducting electrode. The composite contact provides a combined resistive-capacitive coupling to the semiconductor layer. As a result, a contact impedance is reduced when the corresponding semiconductor device is operated at high frequencies.

A first aspect of the invention provides a method of fabricating a semiconductor device, the method comprising: obtaining a semiconductor structure comprising a semiconductor layer; forming a contact to the semiconductor layer, the contact forming including: forming a DC conducting electrode attached to the semiconductor layer; and forming a capacitive electrode, the capacitive electrode partially over the DC conducting electrode and extending beyond the DC conducting electrode.

A second aspect of the invention provides a method of fabricating a semiconductor device, the method comprising: obtaining a semiconductor structure comprising a semiconductor layer; forming a first contact to the semiconductor layer, the first contact forming including: forming a DC conducting electrode attached to the semiconductor layer; and forming a capacitive electrode, the capacitive electrode partially over the DC conducting electrode and extending beyond the DC conducting electrode; and forming a second contact, wherein the second contact forming and capacitive electrode forming are performed simultaneously.

A third aspect of the invention provides a method of fabricating a field effect transistor, the method comprising: obtaining a group III-Nitride based heterostructure comprising a device conducting channel; forming a drain contact to the device conducting channel, the drain contact forming including: forming a DC conducting electrode attached to the device conducting channel; and forming a capacitive electrode, the capacitive electrode partially over the DC conducting electrode and extending beyond the DC conducting electrode.

A fourth aspect of the invention provides a method of fabricating a circuit, the method comprising: fabricating a semiconductor device, the semiconductor device fabricating including: obtaining a semiconductor structure comprising a semiconductor layer; forming a contact to the semiconductor layer, the contact forming including: forming a DC conducting electrode attached to the semiconductor layer; and forming a capacitive electrode, the capacitive electrode partially over the DC conducting electrode and extending beyond the DC conducting electrode; and incorporating the semiconductor device in the circuit.

The illustrative aspects of the invention are designed to solve one or more of the problems herein described and/or one or more other problems not discussed.

BRIEF DESCRIPTION OF THE DRAWINGS

These and other features of the invention will be more readily understood from the following detailed description of the various aspects of the invention taken in conjunction with the accompanying drawings that depict various aspects of the invention.

FIGS. 2A-B show an alternative for forming a capacitive electrode according to an embodiment.

FIGS. 3A-B show another alternative for forming a capacitive electrode according to an embodiment.

FIGS. 5A-D show several embodiments of fabricating a field effect transistor.

It is noted that the drawings are not to scale. The drawings are intended to depict only typical aspects of the invention, and therefore should not be considered as limiting the scope of the disclosure. In the drawings, like numbering represents like elements between the drawings.

DETAILED DESCRIPTION

As indicated above, aspects of the invention provide a method of fabricating a semiconductor device with a composite contact. The fabrication includes forming the composite contact to a semiconductor layer in a semiconductor structure. The composite contact is formed by forming a DC conducting electrode attached to a semiconductor layer in a semiconductor structure and forming a capacitive electrode that is partially over the DC conducting electrode and extends beyond the DC conducting electrode. The composite contact provides a combined resistive-capacitive coupling to the semiconductor layer. As a result, a contact impedance is reduced when the corresponding semiconductor device is operated at high frequencies. As used herein, unless otherwise noted, the term "set" means one or more (i.e., at least one) and the phrase "any solution" means any now known or later developed solution.

Figure 1A:
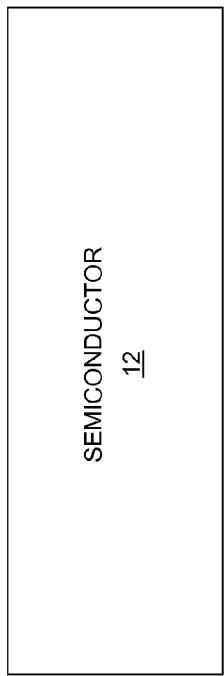
FIGS. 1A-C show an illustrative composite contact formation according to an embodiment.
Figure 1B:
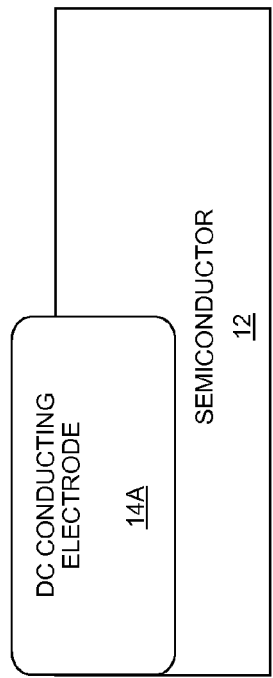
Figure 1C:
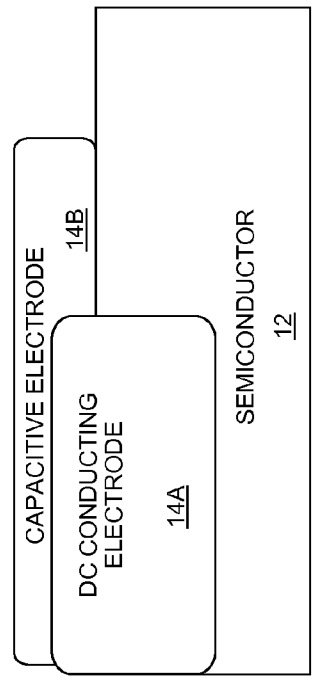

Turning to the drawings, FIGS. 1A-C show an illustrative composite contact formation according to an embodiment. In FIG. 1A, a semiconductor structure 12 is obtained. Semiconductor structure 12 can comprise any type of semiconductor structure. For example, semiconductor structure 12 can be fabricated from silicon (Si), group III-V compounds, group II-VI compounds, silicon carbide (SiC), group III nitride compounds, ternary and/or quaternary alloys of these compounds, and/or the like. Semiconductor structure 12 can be obtained as a pre-fabricated structure and/or can be partially or entirely fabricated using any solution.

In any event, a compound contact 14 (FIG. 1C) is formed to a semiconductor layer in semiconductor structure 12. The semiconductor layer can comprise any type of semiconductor layer, such as a device conducting channel. Further, the device conducting channel can comprise any type of device conducting channel such as a two-dimensional gas (e.g., electron or hole), a doped (n-type or p-type) semiconductor material, an inversion layer (n-type or p-type), and/or the like. In FIG. 1B, a DC conducting electrode (contact) 14A attached to a semiconductor layer in semiconductor structure 12 is formed using any solution. For example, DC conducting electrode 14A can be an Ohmic contact, which is formed by depositing a metal and annealing. DC conducting electrode 14A is deposited above the semiconductor layer, and may or may not be physically contacting the semiconductor layer. During formation of the Ohmic contact, a high annealing temperature may not be required since achieving a low DC contact resistance may not be essential.

Alternatively, DC conducting electrode 14A can comprise a Schottky contact, which can be formed by depositing a metal, but without requiring annealing. In any event, DC conducting electrode 14A can comprise any material, which can be selected based on its properties when interacting with semiconductor structure 12. For example, when semiconductor structure 12 comprises a GaAs or InGaAs-based material, DC conducting electrode 14A can comprise Au/Ge/Ni/Au. However, when semiconductor structure 12 comprises GaN-based material, DC conducting electrode 14A can comprise Ti/Al.

In FIG. 1C, a capacitive electrode (contact) 14B is formed such that a first portion of capacitive electrode 14B is directly on DC conducting electrode 14A and a second portion of capacitive electrode 14B extends beyond DC conducting electrode 14A and is directly on semiconductor structure 12. In this manner, capacitive electrode 14B forms an additional capacitively coupled contact with the semiconductor layer. Each electrode 14A, 14B can comprise any material, such as for example, titanium, aluminum, nickel, gold, and/or the like. During operation of a device formed using semiconductor structure 12 and contact 14 as high frequencies, contact impedance is reduced, e.g., contact 14 comprises a radio-frequency enhanced (RFE) contact.

In alternative embodiments, capacitive electrode 14B may not be formed directly on DC conducting electrode 14A and/or semiconductor structure 12. For example, FIGS. 2A-B show an alternative for forming capacitive electrode 14B according to an embodiment. In FIG. 2A, a barrier layer 16 (e.g., dielectric) is formed on semiconductor structure 12, adjacent to DC conducting electrode 14A. In FIG. 2B, capacitive electrode 14B is formed directly on DC conducting electrode 14A and barrier layer 16 (e.g., dielectric). In this manner, barrier layer 16 further separates the overhanging portion of capacitive electrode 14B from the semiconductor layer in semiconductor structure 12.

FIGS. 3A-B show another alternative for forming capacitive electrode 14B according to an embodiment. In FIG. 3A, a barrier layer 18 (e.g., dielectric) is formed on DC conducting electrode 14A and semiconductor structure 12. In FIG. 3B, capacitive electrode 14B is formed directly on barrier layer 18 (e.g., dielectric), such that a first portion of capacitive electrode 14B is on a portion of barrier layer 18 that is over DC conducting electrode 14A and a second portion of capacitive electrode 14B is on a portion of barrier layer 18 that extends beyond DC conducting electrode 14A. In this manner, barrier layer 18 insulates capacitive electrode 14B from both DC conducting electrode 14A and the semiconductor layer in semiconductor structure 12.

In either embodiment, barrier layer 16 (FIG. 2A) or barrier layer 18 (FIG. 3A) can comprise any type of insulating material, such as a dielectric, a passivation layer, a metal-insulator structure, a wide band gap semiconductor layer, and/or a combination thereof (e.g., a composite dielectric layer). To this extent, barrier layers 16,18 can comprise any material having an energy bandgap that is larger than an energy bandgap of the underlying semiconductor structure 12, and a conductivity that is smaller than a conductivity of the underlying semiconductor structure 12. Depending on the type of semiconductor structure 12, barrier layer 16,18 can comprise silicon dioxide (SiO$_2$), silicon nitride (SiN, Si$_3$N$_4$), silicon oxynitride (SiON), aluminum nitride (AlN), aluminum gallium nitride (AlGaN), aluminum indium gallium nitride (AlInGaN), gallium nitride (GaN), aluminum oxide (Al$_2$O$_3$), hafnium oxide (HfO), strontium titanate (SrTiO$_3$), lanthunum titanate (LaTiO3), gallium oxide (GaO), zinc oxide (ZnO), diamond, and/or the like.

Barrier layers 16, 18 can improve a quality of the contact and/or enable additional functionality. To this extent, a material and/or thickness of barrier layer 16,18 can be selected based on a desired operating characteristic of the device. For example, an amount of capacitive coupling provided by capacitive electrode 14B can be adjusted using barrier layers 16, 18. To this extent, formation of capacitive electrode 14B and/or barrier layer 16, 18 can include determining an amount of capacitive coupling desired for operating a device fabricated with semiconductor structure 12, and selecting a material and/or thickness of barrier layer 16, 18 that will enable the desired amount of capacitive coupling between capacitive electrode 14B and the semiconductor layer in semiconductor structure 12. For example, the required capacitance, C, of capacitive electrode 14B per unit area can be calculated by the formula $$C = \frac{\varepsilon_0 \varepsilon_S}{d_B} \times \left(1 + \frac{d_B}{d_S} \cdot \frac{\varepsilon_S}{\varepsilon_B}\right)^{-1},$$

where $d_B$ and $\varepsilon_B$ are the thickness and dielectric permittivity of barrier layers 16, 18, and $d_S$ and $\varepsilon_S$ are the thickness and dielectric permittivity of the depletion region of the semiconductor layer in semiconductor structure 12.

Further, barrier layer 18 also isolates capacitive electrode 14B from DC conducting electrode 14A. In this case, an additional DC or RF voltage can be applied to capacitive electrode 14B to modulate the conductivity of the semiconductor layer (e.g., device conducting channel) in semiconductor structure 12. For example, by applying a DC voltage to a capacitive electrode 14B that is used as a source and/or drain contact of a field effect transistor, an additional reduction in the access resistance for the field effect transistor can be achieved without requiring more complicated techniques such as selective doping. To this extent, formation of capacitive electrode 14B and/or barrier layer 18 can include determining a desired amount of modulation for the conductivity of the semiconductor layer, and selecting a material and/or thickness of barrier layer 18 that will enable the desired amount of modulation of the conductivity of the semiconductor layer. For example, in a typical field effect transistor device with a threshold voltage of −4 Volts, application of a positive voltage exceeding +4 Volts at capacitive electrode 14B would not only remove the depletion of the semiconductor layer caused by the surface potential, but may nearly double the concentration in the source-gate spacing and thus decrease the access resistance by a factor of nearly two.

As shown and described in more detail in the co-pending U.S. Utility application Ser. No. 11/781,302, titled "Composite contact for semiconductor device", which was filed on 23 Jul. 2007, and which was previously incorporated by reference, the illustrative semiconductor structures and compound contacts described herein can be implemented as part of any type of multi-terminal semiconductor device. As further described therein, the composite contact provides a combined resistive-capacitive coupling to a semiconductor layer, which reduces a contact impedance when a corresponding high frequency semiconductor device is operated at high frequencies and can make a maximum oscillation frequency largely insensitive to DC contact resistance.

Figure 4A:
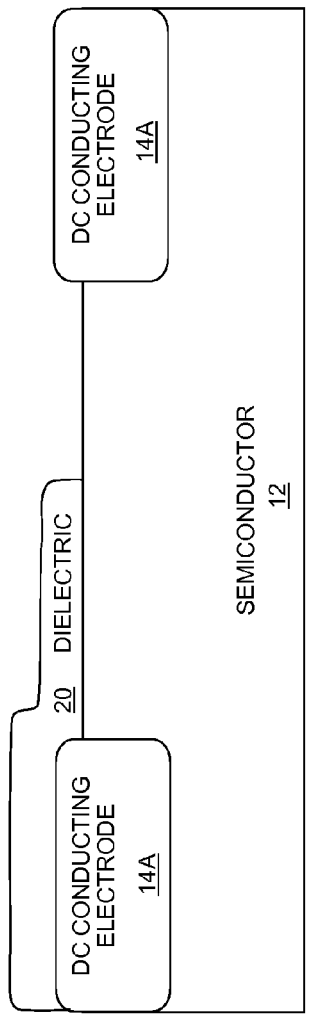
FIGS. 4A-B show the formation of multiple contacts on a semiconductor structure according to an embodiment.
Figure 4B:
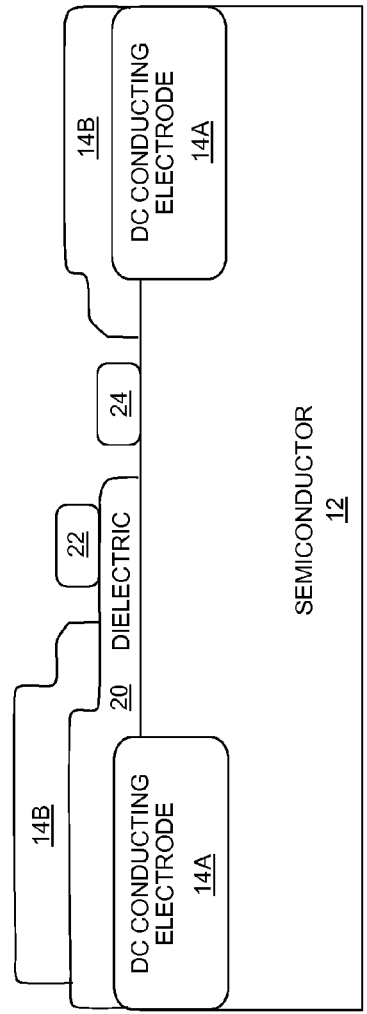

In an embodiment, capacitive electrode 14B can be formed along with one or more contacts for the multi-terminal semiconductor device in an alignment-free manner. The simultaneous formation of multiple contacts enables close spacing between the contacts. For example, FIGS. 4A-B show the formation of multiple contacts on a semiconductor structure according to an embodiment. In FIG. 4A, a semiconductor structure 12 including two DC conducting electrodes 14A is shown. A barrier layer 20 (e.g., a dielectric) is formed over one of the DC conducting electrodes 14A. In FIG. 4B, two capacitive electrodes 14B are formed over DC conducting electrodes 14A simultaneously with two additional contacts 22, 24. As illustrated, one capacitive electrode 14B is formed directly on DC conducting electrode 14A, while the other is formed on dielectric layer 20. Further, contact 22 is also formed on barrier layer 20, while contact 24 is formed directly on semiconductor structure 12. However, it is understood that any number of contacts and/or combinations of types of contacts can be formed using any solution.

Figure 5A:
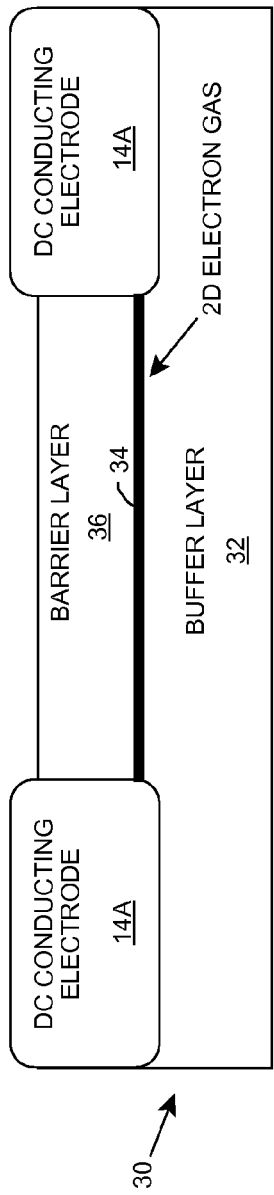

In an embodiment, a field effect transistor includes compound contacts for the source and drain contacts. For example, FIGS. 5A-D show several embodiments of fabricating a heterostructure field effect transistor. In FIG. 5A, a heterostructure 30 is obtained, which includes a buffer layer 32, a device conducting channel, e.g., two degree electron gas 34, and a barrier layer 36. Heterostructure 30 can comprise, for example, a group III-Nitride based heterostructure such as an aluminum gallium nitride/gallium nitride (AlGaN/GaN) heterostructure. It is understood that heterostructure 30 could include one or more additional layers, which are not shown for clarity. Additionally, two DC conducting electrodes 14A, for a source and drain contact are shown formed on heterostructure 30 and attached to two degree electron gas 34.

Figure 5B:
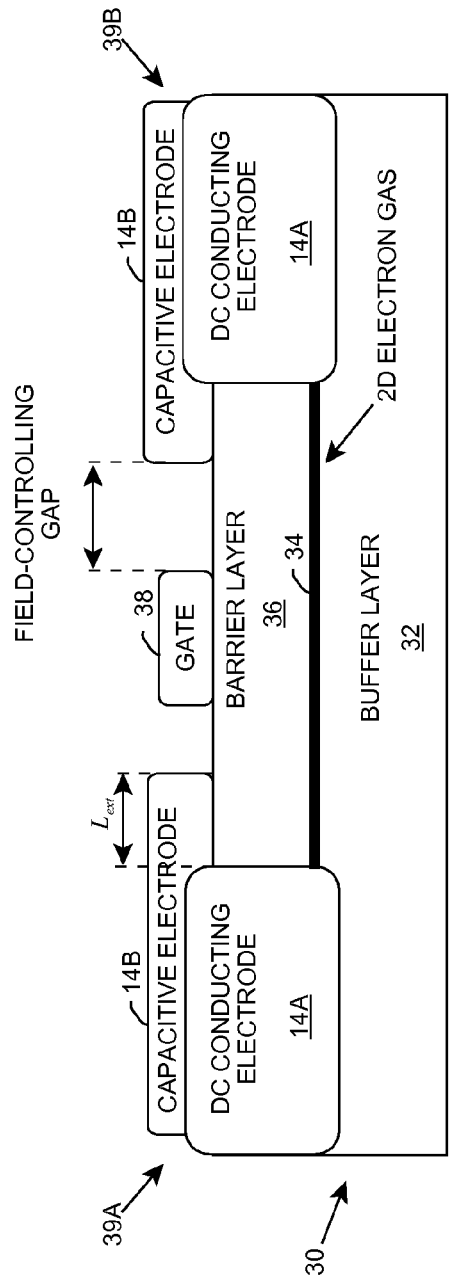

In FIG. 5B, two capacitive electrodes 14B are formed along with a gate 38 in an alignment-free manner. Each capacitive electrode 14B extends beyond the respective DC conducting electrode 14A in a direction towards gate 38. Each capacitive electrode 14B and DC conducting electrode 14A pair create a source contact 39A and drain contact 39B, respectively. It is understood that one or both contacts 39A-B could include additional layer(s), such as a barrier layer between capacitive electrode 14B and DC conducting electrode 14A. These have not been shown for clarity.

Each capacitive electrode 14B overhangs the corresponding DC conducting electrode 14A by a distance, $L_{ext}$, as indicated in FIG. 5B. The distance for the overhang can be selected to provide a desired capacitance between capacitive electrode 14A and the semiconductor layer (e.g., two degree electron gas 34) using any solution. Further, for drain contact 39B, a desired separation distance (e.g., field-controlling gap) between gate 38 and capacitive electrode 14B can be determined. For example, a separation distance that ensures a trapezoidal field distribution in a gate-to-drain spacing of the field effect transistor can be determined. In this case, the formation of gate 38 and/or capacitive electrode 14B for drain contact 39B can include ensuring that the gate-to-drain spacing comprises the separation distance.

In FIG. 5C, fabrication of the device is further shown including forming a set of field plates 40A-B on gate 38 using any solution. When a field plate 40A-B extends beyond gate 38 in a direction toward drain contact 39B, the desired separation distance (e.g., field-controlling gap) can be determined for the field plate 40B that is closest to drain contact 39B and capacitive electrode 14B for the drain contact 39B. The formation of field plate 40B and/or capacitive electrode 14B for drain contact 39B can ensure that the spacing between the field plate 40B and capacitive electrode 14B for drain contact 39B comprises the determined separation distance.

It is understood that various additional processing may be performed in fabricating a device/structure with the composite contacts described herein. To this extent, additional processing such as etching, chemical or thermal treatment, the deposit of one or more layers, and/or the like can be implemented to achieve and/or improve certain aspects of the device functionality using any solution. The processing can be selected based on one or more desired aspects of the device operation, the device type, the materials, and/or the like, using any solution.

For example, FIG. 5D shows an encapsulating layer 42 being formed over a field effect transistor. Encapsulating layer 42 can comprise any insulating material having a high breakdown field, such as a dielectric, to increase the breakdown voltage of the field effect transistor, which can help prevent a premature breakdown due to a surface flashover through the air or another medium adjacent to the device contact region and the spacing between the contacts during operation of the device. Encapsulating layer 42 can comprise a high dielectric strength insulating material that increases a breakdown voltage of the field effect transistor, thereby helping to prevent the premature breakdown of the field effect transistor. The material can have a high breakdown field that well exceeds that of air and is close to that of the material constituting the field effect transistor. Illustrative examples of materials for encapsulating layer 42 include silicon dioxide, silicon nitride, bisbenzocyclobutene, and/or the like. While encapsulating layer 42 is shown in conjunction with a field effect transistor, it is understood that encapsulating layer 42 can be included on any type of semiconductor device.

Further, it is understood that the formation of the composite contacts can be implemented as part of a fabrication process for various types of semiconductor devices, including a field effect transistor, a diode (light-emitting, photodetector, and/or the like), a bipolar junction transistor, a laser, a photodetector, and/or the like. Additionally, a device fabricated using a structure described herein can be incorporated in various types of circuits and applications, including a radio frequency circuit, a microwave amplifier, an oscillator, a switcher, an optoelectronic circuit, and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of fabricating a semiconductor device, the method comprising:
   obtaining a semiconductor structure comprising a semiconductor layer; and
   forming a contact to the semiconductor layer, the contact forming including:
      forming a direct current (DC) conducting electrode attached to the semiconductor layer;
      forming a barrier layer at least partially over the DC conducting electrode; and
      forming a capacitive electrode over the barrier layer, the capacitive electrode partially over and not contacting the DC conducting electrode and extending beyond the DC conducting electrode towards a location for a second contact next to the contact, wherein the capacitive electrode extends only a portion of the distance between the contact and the location for the second contact.

2. The method of claim 1, further comprising forming a barrier layer over the semiconductor layer, the barrier layer separating the capacitive electrode from the semiconductor layer.

3. The method of claim 1, further comprising forming an encapsulating layer over the contact, the encapsulating layer comprising an insulating material.

4. The method of claim 1, the contact comprising a drain contact for a field effect transistor, the method further comprising forming a gate, wherein the gate is the second contact.

5. The method of claim 4, at least one of the gate forming or the contact forming including ensuring that a gate-to-drain spacing comprises a separation distance between the gate and the drain contact that ensures a trapezoidal field distribution in the gate-to-drain spacing.

6. The method of claim 4, further comprising:
   forming at least one field plate for the gate, at least one of the gate forming, the at least one field plate forming, or the contact forming including ensuring that a spacing between the at least one field plate and the drain contact comprises a separation distance that ensures a trapezoidal field distribution in the spacing between the at least one field plate and the drain contact.

7. The method of claim 1, wherein the semiconductor structure comprises a group III-Nitride based heterostructure.

8. A method of fabricating a semiconductor device, the method comprising:
   obtaining a semiconductor structure comprising a semiconductor layer;
   forming a first contact to the semiconductor layer, the first contact forming including:
      forming a direct current (DC) conducting electrode attached to the semiconductor layer; and
      forming a capacitive electrode, the capacitive electrode partially over the DC conducting electrode and extending beyond the DC conducting electrode; and
   forming a second contact next to the first contact, wherein the second contact forming and capacitive electrode forming are performed simultaneously, and wherein the capacitive electrode extends beyond the DC conducting electrode partially to the second contact.

9. The method of claim 8, further comprising forming a barrier layer over at least one of: the semiconductor layer and the DC conducting electrode prior to the capacitive electrode forming.

10. The method of claim 9, further comprising
    selecting at least one of a material or a thickness for the barrier layer based on a desired operating characteristic of the device.

11. The method of claim 10, wherein the operating characteristic comprises at least one of: an amount of capacitive coupling between the capacitive electrode and the semiconductor layer or an amount of modulation for conductivity of the semiconductor layer.

12. The method of claim 9, wherein the barrier layer is formed over at least a portion of the DC conducting electrode and wherein the capacitive electrode is formed over the barrier layer and does not contact the DC conducting electrode.

13. The method of claim 8, further comprising forming an encapsulating layer over the first contact and the second contact, the encapsulating layer comprising an insulating material.

14. The method of claim 8, further comprising forming at least one field plate for the second contact.

15. A method of fabricating a field effect transistor, the method comprising:
   obtaining a group III-Nitride based heterostructure comprising a device conducting channel; and
   forming a drain contact to the device conducting channel, the drain contact forming including:
      forming a direct current (DC) conducting electrode attached to the device conducting channel;
      forming a barrier layer over the DC conducting electrode; and
      forming a capacitive electrode over the barrier layer, the capacitive electrode partially over and not contacting the DC conducting electrode and extending beyond the DC conducting electrode towards a location for a gate, wherein the capacitive electrode extends only a portion of the distance between the contact and the location for the gate.

16. The method of claim 15, further comprising forming the gate, wherein the gate forming and capacitive electrode forming are performed simultaneously.

17. The method of claim 16, further comprising forming at least one field plate for the gate.

18. The method of claim 15, further comprising forming a source contact to the device conducting channel.

19. The method of claim 15, further comprising forming an encapsulating layer over the drain contact and the gate, the encapsulating layer comprising an insulating material.

20. A method of fabricating a field effect transistor, the method comprising:
   obtaining a semiconductor structure comprising a semiconductor layer;
   forming a drain contact to the semiconductor layer, the drain contact forming including:
      forming a direct current (DC) conducting electrode attached to the semiconductor layer; and
      forming a capacitive electrode, the capacitive electrode partially over the DC conducting electrode and extending beyond the DC conducting electrode; and
   forming a gate, the capacitive electrode extending beyond the DC conducting electrode towards the gate, wherein the gate forming and the capacitive electrode forming are performed simultaneously.

* * * * *